(12) United States Patent
Nomoto et al.

(10) Patent No.: US 10,399,906 B2
(45) Date of Patent: Sep. 3, 2019

(54) SIALON SINTERED BODY, METHOD FOR PRODUCING THE SAME, COMPOSITE SUBSTRATE, AND ELECTRONIC DEVICE

(71) Applicant: NGK INSULATORS, LTD., Nagoya (JP)

(72) Inventors: Yuki Nomoto, Nagoya (JP); Katsuhiro Inoue, Ama-Gun (JP); Kei Tanaka, Inazawa (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 24 days.

(21) Appl. No.: 15/703,034

(22) Filed: Sep. 13, 2017

(65) Prior Publication Data

US 2018/0079690 A1    Mar. 22, 2018

(30) Foreign Application Priority Data

Jun. 30, 2017 (JP) .................. 2017-129086

(51) Int. Cl.
*C04B 35/597* (2006.01)
*C04B 35/645* (2006.01)
(Continued)

(52) U.S. Cl.
CPC .......... *C04B 35/597* (2013.01); *C04B 35/645* (2013.01); *C04B 37/00* (2013.01); *C04B 37/001* (2013.01); *B32B 18/00* (2013.01); *C04B 2235/3206* (2013.01); *C04B 2235/3217* (2013.01); *C04B 2235/3225* (2013.01); *C04B 2235/3418* (2013.01); *C04B 2235/3865* (2013.01); *C04B 2235/3869* (2013.01); *C04B 2235/3873* (2013.01); *C04B 2235/3895* (2013.01); *C04B 2235/5436* (2013.01); *C04B 2235/5445* (2013.01); *C04B 2235/656* (2013.01); *C04B 2235/786* (2013.01); *C04B 2235/81* (2013.01); *C04B 2235/85* (2013.01); *C04B 2235/87* (2013.01); *C04B 2235/96* (2013.01); *C04B 2235/963* (2013.01);
(Continued)

(58) Field of Classification Search
CPC ................... C04B 35/597; C01B 21/0826
See application file for complete search history.

(56) References Cited

U.S. PATENT DOCUMENTS 5,234,642 A * 8/1993 Nishioka ............ C04B 35/597 264/626
5,413,972 A * 5/1995 Hwang ............... C04B 35/597 264/122
(Continued)

FOREIGN PATENT DOCUMENTS

JP    60-108371 A1    6/1985
JP    61-141671 A1    6/1986
(Continued)

*Primary Examiner* — Noah S Wiese
(74) *Attorney, Agent, or Firm* — Burr & Brown, PLLC

(57) ABSTRACT

A SiAlON sintered body according to the present invention is represented by $Si_{6-z}Al_zO_zN_{8-z}$ ($0<z\leq4.2$) and has an open porosity of 0.1% or less and a relative density of 99.9% or more. A ratio of a total of intensities of maximum peaks of components other than SiAlON to an intensity of a maximum peak of the SiAlON in an X-ray diffraction diagram is 0.005 or less.

20 Claims, 1 Drawing Sheet

(51) Int. Cl.
*C04B 37/00* (2006.01)
*B32B 18/00* (2006.01)
*H03H 9/02* (2006.01)
*H03H 9/145* (2006.01)

(52) U.S. Cl.
CPC ............ *C04B 2235/9607* (2013.01); *C04B 2237/345* (2013.01); *C04B 2237/36* (2013.01); *C04B 2237/368* (2013.01); *C04B 2237/55* (2013.01); *C04B 2237/704* (2013.01); *H03H 9/02543* (2013.01); *H03H 9/02574* (2013.01); *H03H 9/145* (2013.01)

(56) References Cited

U.S. PATENT DOCUMENTS

| | | | | |
|---|---|---|---|---|
| 6,187,254 | B1* | 2/2001 | Collin | C04B 35/5935 264/640 |
| 8,772,190 | B2* | 7/2014 | Shen | C04B 35/593 384/492 |
| 2002/0107135 | A1* | 8/2002 | Roy | C04B 35/597 501/98.2 |
| 2007/0160858 | A1* | 7/2007 | Fukuda | C04B 37/026 428/469 |
| 2011/0266719 | A1* | 11/2011 | Shen | C04B 35/593 264/430 |

FOREIGN PATENT DOCUMENTS

| | | |
|---|---|---|
| JP | 62-212268 A1 | 9/1987 |
| JP | 01-264973 A1 | 10/1989 |

* cited by examiner

SIALON SINTERED BODY, METHOD FOR PRODUCING THE SAME, COMPOSITE SUBSTRATE, AND ELECTRONIC DEVICE

BACKGROUND OF THE INVENTION

1. Field of the Invention

The present invention relates to a SiAlON sintered body, a method for producing the same, a composite substrate, and an electronic device.

2. Description of the Related Art

SiAlON is a general name for substances represented by general formula: $Si_{6-z}Al_zO_zN_{8-z}$ (0<z≤4.2) and is a material that has all of high strength, high Young's modulus, low thermal expansion, and high insulation among ceramic materials. In order to use this ceramic material as a supporting substrate of a composite substrate for an acoustic wave element, absence of pores, high surface flatness, and homogeneity of the composition throughout the entire surface are required for joining. As indicated in PTL 1, generally, a sintering aid is used for firing to produce SiAlON. A method in which firing is conducted without using a sintering aid in producing SiAlON is also known. For example, PTL 2 discloses a method with which β-SiAlON is covered with powders of silicon nitride and BN and fired in a $N_2$ gas atmosphere. PTL 3 discloses a method with which aluminum alkoxide is added to a silicon nitride powder, the mixture is hydrolyzed, and then powder obtained by filtration is calcined at 600° C. to 900° C. and pressure-sintered at 1700° C. to 1900° C. so as to obtain a β-SiAlON sintered body.

CITATION LIST

Patent Literature

[PTL 1] Japanese Unexamined Patent Application Publication No. 1-264973

[PTL 2] Japanese Unexamined Patent Application Publication No. 61-141671

[PTL 3] Japanese Unexamined Patent Application Publication No. 60-108371

SUMMARY OF THE INVENTION

However, when a sintering aid is used in producing SiAlON as in PTL 1, there arise problems of the composition becoming inhomogeneous, occurrence of large quantities of different phase components, and an increase in the number of pores. The occurrence of large quantities of different phase components leads to a problem of insufficient surface flatness since the SiAlON and the different phase components have different polishabilities. For example, when a different phase component is harder than the SiAlON, the different phase component is more difficult to polish and tends to leave protrusions; and when a different phase component is softer, the different phase component is more easy to polish and tends to leave holes. Moreover, if the material has many pores therein, recessed portions derived from pores remain even after polishing, leading to a problem of insufficient surface flatness. When normal-pressure firing is conducted without using a sintering aid in producing SiAlON as in PTL 2 and PTL 3, pores are not completely discharged to the outside and tend to remain inside since the SiAlON is a material difficult to sinter. Thus, it has been difficult to sufficiently increase the relative density.

The present invention has been made to address these problems and aims to provide a SiAlON sintered body that has high surface flatness when the surface is mirror-polished.

A SiAlON sintered body according to the present invention is represented by $Si_{6-z}Al_zO_zN_{8-z}$ (0<z≤4.2) and has an open porosity of 0.1% or less and a relative density of 99.9% or more. A ratio of a total of intensities of maximum peaks of components other than SiAlON to an intensity of a maximum peak of the SiAlON in an X-ray diffraction diagram is 0.005 or less. Since the SiAlON sintered body has a low open porosity, a high relative density, and few different phases, the surface flatness is enhanced when the surface is mirror-polished.

A method for producing the SiAlON sintered body according to the present invention includes preparing a raw material powder by selecting components from silicon nitride, aluminum nitride, alumina, and silica all having a purity of 99.8% by mass or higher so that Si:Al:O:N=(6-z):z:z:(8-z) (0<z≤4.2), determining mass ratios of the respective components, and mixing the components; forming the raw material powder into a predetermined shape; and then hot-press firing the formed raw material powder at a firing temperature of 1725° C. to 1900° C. and a press pressure of 100 to 300 kgf/cm² to obtain the SiAlON sintered body. Since densification can proceed while discharging the pores by pressure in this method, the method is suitable for producing the SiAlON sintered body according to the present invention described above.

A composite substrate according to the present invention is a composite substrate in which a supporting substrate and a functional substrate are joined. The supporting substrate is the SiAlON sintered body described above. Since the supporting substrate of the composite substrate is the SiAlON sintered body according to the present invention described above, the ratio of the actual joining area in the joining interface is increased, and satisfactory joinability is exhibited.

An electronic device according to the present invention uses the composite substrate according to the present invention described above. In this electronic device, the thermal expansion coefficient of the SiAlON sintered body constituting the supporting substrate is 3.0 ppm/K (40° C. to 400° C.) or less; thus, when a surface acoustic wave device is prepared, the frequency temperature dependence and the filtering performance are notably improved. In a Lamb wave device, a film bulk acoustic resonator (FBAR), an LED device, an optical waveguide device, a switch device, a semiconductor device, etc., also, performance is improved because the thermal expansion coefficient of the supporting substrate is very small. Moreover, by adjusting the composition (the value of z described above) of the SiAlON, the Young's modulus can be adjusted while maintaining the thermal expansion coefficient to 3.0 ppm/K or less. As a result, when a composite substrate is prepared therefrom, the performance of the functional substrate can be finely tuned and maximized.

DETAILED DESCRIPTION OF THE INVENTION

Figure 1:
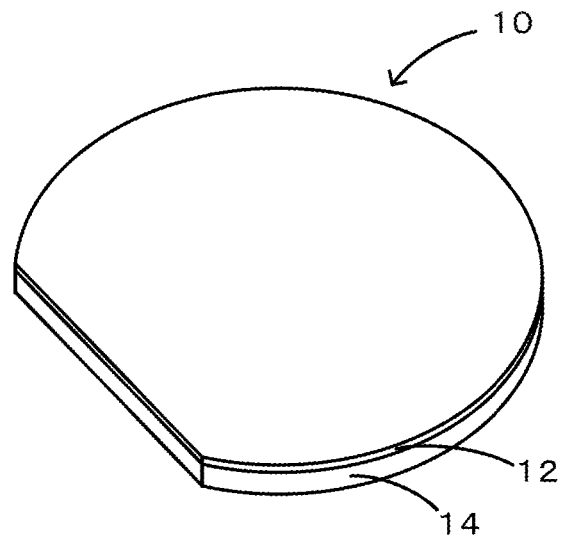
FIG. 1 is a perspective view of a composite substrate 10.

Embodiments of the present invention will now be specifically described but these embodiments do not limit the present invention. It is to be understood that appropriate modifications, improvements, etc., may be made on the basis of common knowledge of a person skilled in the art without departing from the gist of the present invention.

A SiAlON sintered body according to an embodiment is represented by $Si_{6-z}Al_zO_zN_{8-z}$ ($0<z\leq4.2$) and has an open porosity of 0.1% or less and a relative density of 99.9% or more (preferably 99.95% or more), in which a ratio of a total of intensities of maximum peaks of components (different phase components) other than SiAlON to an intensity of a maximum peak of the SiAlON in an X-ray diffraction diagram is 0.005 or less. The measurement conditions for the X-ray diffraction diagram are CuKα, 40 kV, 40 mA, and 2θ=10° to 70°. Because the SiAlON sintered body has a low open porosity and a high relative density and contains few different phases, the surface flatness when the surface is mirror-polished is high. If the open porosity is high or the relative density is low, recessed portions derived from pores remain even after polishing and thus the surface flatness is not sufficiently high. If large quantities of different phase components are contained, the surface flatness is not sufficiently high since the SiAlON and the different phase components have different polishabilities. In particular, when a different phase component is more difficult to polish, different phase portions tend to leave protrusions, and joining with a functional substrate becomes difficult. Examples of the different phase component include $Al_2O_3$, $Si_2ON_2$, $Si_3Al_6O_{12}N_2$, and mullite.

With the SiAlON sintered body according to this embodiment, the number of pores that are present in the polish-finished surface can be decreased. The number of pores that have a maximum length of 0.5 μm or more and a depth of 0.08 μm or more and that are present in a 100 μm×100 μm area of the polish-finished surface is preferably 10 or less, more preferably 5 or less, and yet more preferably 3 or less.

The surface flatness of the SiAlON sintered body according to this embodiment preferably satisfies, for example, at least one of the following: that the centerline mean roughness Ra is 1.0 nm or less in a 100 μm×140 μm measurement range in a mirror-polished surface and that the difference Pt between the maximum peak height and the maximum valley depth in the same measurement range is 30 nm or less. Ra is more preferably 0.8 nm or less and Pt is more preferably 25 nm or less.

The SiAlON sintered body according to this embodiment preferably has a Young's modulus of 180 GPa or more, more preferably 200 GPa or more, and yet more preferably 220 GPa or more.

In the SiAlON sintered body according to this embodiment, the value of z is preferably $0.5\leq z\leq4.0$. Within this range, the number of pores can be further decreased. The value of z is more preferably $0.5\leq z\leq3.2$. Within this range, the number of pores can be yet further decreased.

An embodiment of a method for producing a SiAlON sintered body is described next. The flow of producing a SiAlON sintered body includes a step of preparing a SiAlON raw material powder and a step of preparing a SiAlON sintered body.

(Preparation of SiAlON Raw Material Powder)

Commercially available silicon nitride, aluminum nitride, alumina, and silica powders having an impurity metal element content of 0.2% by mass or less and an average particle diameter of 2 μm or less are used in a raw material powder. By using these raw materials, the composition is selected so that Si:Al:O:N=(6-z):z:z:(8-z) (where $0<z\leq4.2$), the mass ratios are determined, and the components are mixed to prepare a raw material powder. The value of z is preferably $0.5\leq z\leq4.0$ and more preferably $0.5\leq z\leq3.2$. Each powder is preferably fine for dense sintering and preferably has an average particle diameter of 0.5 to 1.5 μm. Alternatively, precursor substances that generate those components when heated may be used as raw materials for the respective components. The powders are mixed and dispersed in a solvent to prepare a slurry having a SiAlON composition. The mixing method is not limited. For example, a ball mill, an attritor, a bead mill, a jet mill, or the like can be used. During this process, sufficient care should be taken for the component that will mix in from the media and the amount of such a component. That is, balls and pots of alumina or silicon nitride, which do not constitute impurities even when they mix in, are preferably used as the media. Resin pots and balls can be used since resin can be removed in the firing step and the like. Metal media are not preferable since the amount of impurities increases. The obtained slurry is dried, and the dried product is sifted through a screen to prepare a SiAlON raw material powder. When the composition deviated due to mixing-in of medium components or the like during pulverizing the composition is adjusted as appropriate to prepare a raw material powder. Alternatively, the masses of the respective components of the mixed powder may be adjusted in advance so that a desired SiAlON composition is obtained despite masses of the respective components contained in the pulverized substances, and the pulverized product may be directly used as the SiAlON raw material powder.

(Preparation of SiAlON Sintered Body)

The obtained SiAlON raw material powder is formed into a predetermined shape. The method for forming is not particularly limited, and a typical forming method can be used. For example, the SiAlON raw material powder described above may be directly press-formed by using a mold. For press forming, the SiAlON raw material powder may be first formed into granules by spray drying so as to improve formability. Alternatively, an organic binder may be added to prepare clay and the clay may be extrusion-molded, or a slurry may be prepared and formed into a sheet. According to these processes, it becomes necessary to remove the organic binder component before or during the firing step. Alternatively, high-pressure forming may be conducted through cold isostatic pressing (CIP).

Next, the obtained formed body is fired to prepare a SiAlON sintered body. During this process, in order to enhance the surface flatness of the SiAlON sintered body, it is important that the sintered grains remain fine and pores be discharged during sintering. A hot pressing method is highly useful as such a technique. By using the hot pressing method, densification proceeds while the grains are in an ultra-fine state at a low temperature compared to normal-pressure sintering, and residual coarse pores, which are frequently observed in normal-pressure sintering, can be suppressed. The firing temperature during hot pressing is preferably 1725° C. to 1900° C. and is more preferably 1750° C. to 1900° C. to decrease different phases as much as possible. The press pressure during hot pressing is preferably 100 to 300 kgf/cm² and is more preferably 150 to 250 kgf/cm². The time of holding the firing temperature (maximum temperature) may be appropriately selected in view of the shape and size of the formed body and properties of a heating furnace, etc. Specifically, the holding time is preferably 1 to 12 hours and more preferably 2 to 8 hours, for example. In hot pressing, the firing atmosphere is preferably a nitrogen atmosphere to avoid decomposition of SiAlON.

Next, an embodiment of a composite substrate is described. A composite substrate is made by joining a functional substrate and a supporting substrate formed of the SiAlON sintered body described above. In the joining interface, the ratio (joining area ratio) of the actual joining area is preferably 80% or more and more preferably 90% or more. When the joining area ratio is as large as such, the functional substrate and the supporting substrate exhibit excellent joinability. The functional substrate may be any and, for example, may be composed of lithium tantalite (LT), lithium niobate (LN), gallium nitride, or silicon. The joining method may be direct joining or joining by using an intermediate adhesive layer; however, direct joining is preferable. In direct joining, the joining surfaces of the functional substrate and the supporting substrate are activated and then the two substrates are pressurized with the joining surfaces facing each other. Activation of the joining surfaces is, for example, conducted by irradiation of the joining surfaces with a neutral atomic beam of an inert gas (such as argon) or with a plasma or an ion beam. When joining is performed by using an intermediate adhesive layer, an epoxy resin or an acrylic resin is used as the adhesive layer. The ratio of the thickness of the functional substrate to the thickness of the supporting substrate (thickness of functional substrate/thickness of supporting substrate) is preferably 0.1 or less. One example of the composite substrate is illustrated in FIG. 1. A composite substrate 10 is formed by directly joining a piezoelectric substrate 12, which is a functional substrate, and a supporting substrate 14.

Figure 2:
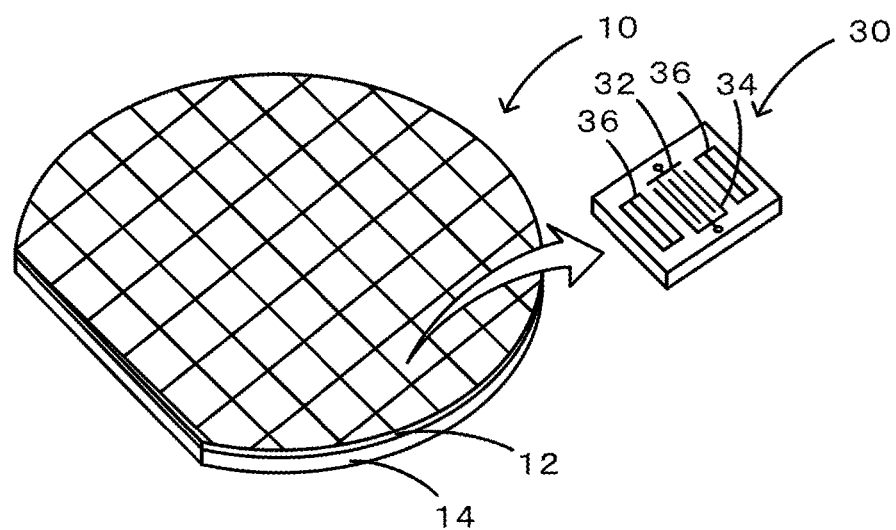
FIG. 2 is a perspective view of an electronic device 30 prepared by using the composite substrate 10.

Next, an embodiment of an electronic device is described. The electronic device uses the composite substrate described above. Examples of the electronic device include acoustic wave devices (surface acoustic devices, Lamb wave devices, film bulk acoustic resonators (FBARs), etc.), LED devices, optical waveguide devices, and switch devices. When the composite substrate is used in an acoustic wave device, the confining power of the functional substrate is enhanced because the thermal expansion coefficient of the SiAlON sintered body constituting the supporting substrate is as small as 3.0 ppm/K (40° C. to 400° C.) or less and the Young's modulus is high. As a result, the temperature dependence of the frequency of device is notably improved. FIG. 2 illustrates an example of an electronic device 30 prepared by using the composite substrate 10. The electronic device 30 is a one-port SAW resonator, i.e., a surface acoustic wave device. First, a pattern of a large number of electronic devices 30 is formed by a typical photolithographic technique on the piezoelectric substrate 12 of the composite substrate 10, and then the substrate is diced to cut out individual electronic devices 30. The electronic device 30 has interdigital transducer (IDT) electrodes 32 and 34 and reflector electrodes 36 formed on the piezoelectric substrate 12 by a photolithographic technique.

EXAMPLES

The examples of the present invention will now be described. The examples do not limit the present invention in any way.

1. Preparation of Raw Material Powder

Commercially available silicon nitride powder (oxygen content: 1.3% by mass, impurity metal element content: 0.2% by mass or less, average particle diameter: 0.6 μm), aluminum nitride (oxygen content: 0.8% by mass, impurity metal element content: 0.1% by mass or less, average particle diameter: 1.1 μm), alumina (purity: 99.9% by mass, average particle diameter 0.5 μm), and silica (purity: 99.9% by mass, average particle diameter: 0.5 μm) were used in the raw material powder.

TABLE 1

| SiAlON raw material powder | Value of z | $Si_3N_4$ (% by mass) | AlN (% by mass) | $Al_2O_3$ (% by mass) | $SiO_2$ (% by mass) | $Y_2O_3$ (% by mass) | MgO (% by mass) |
|---|---|---|---|---|---|---|---|
| | | Raw material component | | | | | |
| A | 0.5 | 87.3 | 7.3 | 0.0 | 5.4 | 0.0 | 0.0 |
| B | 1.0 | 74.7 | 14.6 | 0.0 | 10.7 | 0.0 | 0.0 |
| C | 1.0 | 83.0 | 4.9 | 12.1 | 0.0 | 0.0 | 0.0 |
| D | 1.8 | 54.7 | 26.1 | 0.0 | 19.2 | 0.0 | 0.0 |
| E | 2.5 | 37.2 | 36.2 | 0.0 | 26.6 | 0.0 | 0.0 |
| F | 3.2 | 19.8 | 46.3 | 0.0 | 33.9 | 0.0 | 0.0 |
| G | 4.0 | 0.0 | 57.7 | 0.0 | 42.3 | 0.0 | 0.0 |
| J | 2.0 | 46.7 | 28.5 | 0.0 | 24.8 | 0.0 | 0.0 |

| Silicon nitride raw material powder | Value of z | $Si_3N_4$ (% by mass) | AlN (% by mass) | $Al_2O_3$ (% by mass) | $SiO_2$ (% by mass) | $Y_2O_3$ (% by mass) | MgO (% by mass) |
|---|---|---|---|---|---|---|---|
| | | Raw material component | | | | | |
| H | 0.0 | 100.0 | 0.0 | 0.0 | 0.0 | 0.0 | 0.0 |
| I | 0.0 | 95.0 | 0.0 | 0.0 | 0.0 | 3.0 | 2.0 |

SiAlON raw material powders A to G and J were prepared as follows. That is, the powders of silicon nitride, aluminum nitride, alumina, and silica were weighed so as to obtain a SiAlON composition ($Si_{6-z}Al_zO_zN_{8-z}$) with a value of z indicated in Table 1. The weighed powders were mixed in a ball mill using alumina balls (5 mm in diameter) and isopropyl alcohol as a solvent for 4 hours to prepare a slurry of the mixed powder. The slurry was dried at 110° C. under a nitrogen gas flow, and the dried mixture was sifted through a screen to obtain SiAlON raw material powders A to G and J. In order to suppress occurrence of different phase components, the SiAlON raw material powder preferably has a low excess oxygen content. The excess oxygen content in each of the SiAlON raw material powders A to G was 1.0% by mass or less. The excess oxygen content in the SiAlON raw material powder J was 2.7% by mass.

The silicon nitride powder described above was used alone as a silicon nitride raw material powder H. A silicon nitride raw material powder I was prepared by weighing powders of silicon nitride, yttria (purity: 99.9% by mass or higher, average particle diameter: 1.1 μm), and magnesia (purity: 99.9% by mass, average particle diameter: 1.8 μm) so as to obtain a composition indicated in Table 1, preparing a dried mixture as with the SiAlON raw material powders A to G and J, and sifting the dried mixture through a screen.

2. Preparation and Evaluation of Sintered Body (1) Experimental Example 1

A SiAlON sintered body of Experimental Example 1 was prepared by forming the SiAlON raw material powder A to have a diameter of 125 mm and a thickness of about 20 mm by using a mold and then hot-press-firing the formed powder A in a graphite mold at a press pressure of 200 kgf/cm² and a maximum temperature of 1800° C. for 4 hours. The firing atmosphere was a nitrogen atmosphere. The obtained sintered body had a diameter of 125 mm and a thickness of about 8 mm. From this sintered body, a flexural bar 4 mm×3 mm×40 mm in size, etc., were cut out, and various properties were evaluated therefrom. Methods for evaluating various properties are described below. The results are indicated in Table 2. The properties of the surface of the sintered body were evaluated by mirror-finishing one surface of a test piece about 4 mm×3 mm×10 mm in size by polishing. Polishing was conducted with a 3 μm diamond abrasive grains, with lap-polishing conducted with 0.5 μm diamond abrasive grains at the last stage.

Bulk Density and Open Porosity

Measurement was conducted by the Archimedes' principle using distilled water.

Relative Density

The relative density was calculated as bulk density/apparent density.

Crystal Phase and Peak Intensity Ratio Ix

The SiAlON sintered body was pulverized. The SiAlON and different phases were identified, and the intensity of the maximum peak of each phase was calculated by using an X-ray diffractometer. In identifying the different phases, sufficient care should be taken for the phases that have mixed in from media such as a mortar and a muddler during pulverization of the sintered body, and for the amounts of such phases. An automatic all-purpose X-ray analyzer, D8 ADVANCE was used as the XRD analyzer, and the measurement conditions were CuKα, 40 kV, 40 mA, and 2θ=10° to 70°. From the X-ray diffraction diagram, the ratio (peak intensity ratio Ix) of the total of the intensities (Ip, Iq, Ir, . . . ) of the detected maximum peaks of the respective different phases (P, Q, R, . . . ) to the intensity (Ic) of the maximum peak (2θ=32.8° to 33.5°) of the SiAlON was determined using the equation below. When a maximum peak overlapped another peak, the peak having the second highest peak intensity was used instead of the maximum peak.

$Ix = (Ip + Iq + Ir \ldots)/Ic$

Average Grain Diameter of SiAlON Sintered Grains

The SiAlON sintered grains in a fracture surface were observed with a SEM in a 127 μm×88 μm view area, the grain diameters of ten or more SiAlON sintered grains in the view area were determined, and the average thereof was assumed to be the average grain diameter of the SiAlON sintered grains. The grain diameter of one SiAlON sintered grain was assumed to be an average value of the length of the major axis and the length of the minor axis of that sintered grain.

Number of Pores

The surface mirror-finished as described above was observed with a 3D measurement laser microscope. The number of pores having a maximum length of 0.5 μm or more and a depth of 0.08 μm or more per unit area was counted at four positions, and the average was assumed to be the number of pores. The unit area was the 100 μm square area.

Surface Flatness

The surface mirror-finished as described above was measured with a three dimensional optical profiler (Zygo) to determine the centerline mean roughness Ra and the difference Pt between the maximum peak height and the maximum valley depth. Ra and Pt in this description respectively correspond to the arithmetical mean roughness Ra of a primary profile and a total height Pt of the primary profile specified in JIS B 0601:2013. The Ra and Pt were assumed to indicate the surface flatness. The measurement range was 100 μm×140 μm.

Young's Modulus

Measurement was conducted by a static flexure method according to JIS R 1602. The test piece shape was a 3 mm×4 mm×40 mm flexural bar.

Thermal Expansion Coefficient (40° C. to 400° C.)

Measurement was conducted by a push-rod differential method according to JIS R 1618. The test piece shape was 3 mm×4 mm×20 mm.

TABLE 2

| | Manufacturing condition | | | Property of sintered body | | | | | | | | | | |
|---|---|---|---|---|---|---|---|---|---|---|---|---|---|---|
| Experimental Example | Raw material powder | Value of z | Temperature (° C.) × Time (h) | Bulk density (g/cm³) | Apparent density (g/cm³) | Open porosity (%) | Relative density (%) | Phase other than SiAlON | Peak intensity 1x | Average grain diameter of SiAlON (μm) | Number of voids (Number) | Ra (nm) | Pt (nm) | Young's modulus (GPa) | CTE[X1] (pm/K) |
| 1 | A | 0.5 | 1800 × 4 | 3.160 | 3.160 | 0.00 | 100.00 | Al₂O₃, Si₂ON₂ | 0.0012 | 2 | 1 | 0.4 | 15 | 307 | 2.7 |
| 2 | B | 1.0 | 1800 × 4 | 3.148 | 3.149 | 0.00 | 99.97 | Al₂O₃ | 0.0012 | 3 | 1 | 0.5 | 9 | 298 | 2.7 |
| 3 | D | 1.8 | 1800 × 4 | 3.117 | 3.118 | 0.01 | 99.97 | Al₂O₃ | 0.0013 | 4 | 1 | 0.5 | 13 | 275 | 2.7 |
| 4 | E | 2.5 | 1800 × 4 | 3.092 | 3.092 | 0.00 | 100.00 | Al₂O₃ | 0.0015 | 7 | 1 | 0.8 | 10 | 253 | 2.6 |
| 5 | F | 3.2 | 1800 × 4 | 3.080 | 3.081 | 0.00 | 99.97 | Al₂O₃ | 0.0015 | 8 | 1 | 0.8 | 8 | 225 | 2.6 |
| 6 | G | 4.0 | 1800 × 4 | 3.041 | 3.042 | 0.00 | 99.97 | Al₂O₃ | 0.0037 | 18 | 5 | 0.9 | 27 | 214 | 2.6 |
| 7 | C | 1.0 | 1800 × 4 | 3.148 | 3.149 | 0.01 | 99.97 | Al₂O₃ | 0.0012 | 3 | 1 | 0.5 | 16 | 297 | 2.7 |
| 8 | A | 0.5 | 1750 × 4 | 3.160 | 3.161 | 0.01 | 99.97 | Al₂O₃, Si₂ON₂ | 0.0013 | 2 | 1 | 0.4 | 17 | 307 | 2.7 |
| 9 | B | 1.0 | 1750 × 4 | 3.146 | 3.147 | 0.01 | 99.97 | Al₂O₃ | 0.0014 | 3 | 1 | 0.5 | 23 | 297 | 2.7 |
| 10 | E | 2.5 | 1750 × 4 | 3.090 | 3.091 | 0.01 | 99.97 | Al₂O₃ | 0.0021 | 6 | 2 | 0.8 | 21 | 252 | 2.6 |
| 11 | F | 3.2 | 1750 × 4 | 3.080 | 3.081 | 0.00 | 99.97 | Al₂O₃ | 0.0023 | 8 | 1 | 0.8 | 22 | 225 | 2.6 |
| 12 | D | 1.8 | 1725 × 4 | 3.116 | 3.117 | 0.01 | 99.97 | Al₂O₃ | 0.0017 | 4 | 1 | 0.5 | 16 | 274 | 2.7 |
| 13 | A | 0.5 | 1700 × 4 | 3.121 | 3.161 | 0.23 | 98.73 | Al₂O₃, Si₂ON₂ | 0.0020 | 2 | 33 | 0.7 | 27 | 307 | 2.7 |
| 14 | B | 1.0 | 1700 × 4 | 3.120 | 3.151 | 0.18 | 99.02 | Al₂O₃ | 0.0017 | 2 | ≥50 | 0.7 | 19 | 297 | 2.7 |
| 15 | D | 1.8 | 1700 × 4 | 3.110 | 3.117 | 0.12 | 99.78 | Al₂O₃ | 0.0027 | 5 | ≥50 | 0.8 | 11 | 274 | 2.6 |
| 16 | F | 3.2 | 1700 × 4 | 3.080 | 3.081 | 0.01 | 99.97 | Al₂O₃ | 0.0221 | 7 | 2 | 1.1 | 39 | 221 | 2.6 |
| 17 | H | 0.0 | 1800 × 4 | 1.517 | 3.164 | 52.10 | 47.95 | — | — | — | — | — | — | — | — |
| 18 | I | 0.0 | 1800 × 4 | 3.212 | 3.217 | 0.03 | 99.84 | Si₃N₄ | — | 3 | ≥50 | 0.9 | 25 | 351 | 2.9 |
| 19 | J | 2.0 | 1750 × 4 | 3.108 | 3.109 | 0.02 | 99.98 | Si₃Al₆O₁₂N₂ | 0.0492 | 5 | 3 | 1.6 | 34 | 267 | — |

[X1]Thermal expansion coefficient at 40-400° C.

As indicated in Table 2, the SiAlON sintered body of Experimental Example 1 had excellent properties. Specifically, the bulk density, the open porosity, and the relative density of the SiAlON sintered body of Experimental Example 1 were, respectively, 3.16 g/cm$^3$, 0.00%, and 100%. In addition to SiAlON, minute amounts of alumina and silicon oxynitride were detected as the crystal phases. The ratio (peak intensity ratio) Ix of the total of the intensities of the maximum peaks of the components other than SiAlON to the intensity of the maximum peak of SiAlON was as small as 0.0012. In a 100 μm×100 μm range of the polished surface, the number of pores having a maximum length of 0.5 μm or more was as small as 1. It was found that the surface flatness of the polished surface had a centerline mean roughness Ra as small as 0.4 nm, and the difference Pt between the maximum peak height and the maximum valley depth was as small as 15 nm.

(2) Experimental Examples 2 to 6

The SiAlON sintered bodies of Experimental Examples 2 to 6 were prepared by hot-press firing as in Experimental Example 1 but by using the SiAlON raw material powders B and D to G indicated in Table 1 instead of the SiAlON raw material powder A. The properties of the SiAlON sintered bodies are indicated in Table 2. The SiAlON sintered bodies all had an open porosity of 0.1% or less, a relative density of 99.9% or more, 10 or less pores, and a peak intensity ratio Ix of 0.005 or less, and had excellent properties.

(3) Experimental Example 7

The SiAlON sintered body of Experimental Example 7 was prepared by hot-press sintering as in Experimental Example 1 but by using a SiAlON raw material powder C. The SiAlON raw material powder C had the same z value of 1.0 as the SiAlON raw material powder B used in Experimental Example 2 but differed from the SiAlON raw material powder B in that while the powder C used three starting materials, Si$_3$N$_4$, AlN, and Al$_2$O$_3$, the powder B used three starting materials, Si$_3$N$_4$, AlN and SiO$_2$. Since the SiAlON sintered body of Experimental Example 7 had as excellent properties as the SiAlON sintered body of Experimental Example 2, it was found that the starting materials are to be selected as appropriate from Si$_3$N$_4$, AlN, Al$_2$O$_3$, and SiO$_2$, so that a desired SiAlON is obtained.

(4) Experimental Examples 8 to 12

Experimental Examples 8 to 11 were examples in which the maximum temperature during firing in Experimental Examples 1, 2, 4, and 5 was changed to 1750° C. Experimental Example 12 was an example in which the maximum temperature during firing in Experimental Example 3 was changed to 1725° C. As indicated in Table 2, it was found that the SiAlON sintered bodies of Experimental Examples 8 to 12 had as excellent properties as the SiAlON sintered bodies of Experimental Examples 1 to 5.

The SiAlON sintered bodies of Experimental Examples 1 to 12 had an excess oxygen content of 1.0% by mass or less.

(5) Experimental Examples 13 to 16

Experimental Examples 13 to 16 were examples in which the maximum temperature during firing in Experimental Examples 1 to 3 and 5 was changed to 1700° C. The SiAlON sintered bodies of Experimental Examples 13 to 15 had an open porosity exceeding 0.1, a relative density less than 99.9%, indicating insufficient densification, and many pores, for example, 33 or 50 or more pores, because the firing temperature was excessively low. The SiAlON sintered body of Experimental Example 16 had an open porosity of 0.01%, a relative density of 99.97%, and 2 pores, but had a peak intensity ratio Ix as high as 0.0221, resulting in degraded centerline mean roughness Ra and degraded total height Pt. A presumable cause for the high peak intensity ratio Ix is that because the firing temperature was excessively low, the reactions of the raw material components (formation of SiAlON) became insufficient and alumina, which is one of the intermediate products, precipitated in large quantities as different phases. A presumable cause for degradation of the centerline mean roughness Ra and the difference Pt between the maximum peak height and the maximum valley depth is that because polishability differs between the alumina, which has precipitated as different phases, and SiAlON, alumina left protrusions.

(6) Experimental Examples 17 and 18

In Experimental Example 17, hot-press firing was performed as in Experimental Example 1 except that a silicon nitride raw material powder H (z=0) was used as the starting material. The obtained fired body had an open porosity of 52.1% and a relative density of 47.95% and did not sinter. In Experimental Example 18, hot-press firing was performed as in Experimental Example 1 except that a silicon nitride raw material powder I (z=0, Y$_2$O$_3$ and MgO serving as a sintering aid were added) was used as the starting material. The obtained sintered body had a microstructure in which columnar crystals unique to silicon nitride were developed, and pores were observed in grain boundaries. Thus, in a 100 μm square range of the polished surface, there were 50 or more pores having a maximum length of 0.5 μm or more, and the number of pores could not be decreased.

(7) Experimental Example 19

The SiAlON sintered body of Experimental Example 19 was hot-press fired as in Experimental Example 8 but by using a SiAlON raw material powder J. The obtained fired body had a relative density of 99.98%, and the number of pores was 3 indicating sufficient densification. However, the peak intensity ratio Ix was as high as 0.0492, and large quantities of different phases precipitated. Thus, the centerline mean roughness Ra and the value of the total height Pt were degraded, and sufficient flatness was not obtained. The SiAlON sintered body of Experimental Example 19 had an excess oxygen content of 2.7% by mass, and corresponds to Example 1 in Japanese Unexamined Patent Application Publication No. 62-212268.

Of Experimental Examples 1 to 19 described above, Experimental Examples 1 to 12 are the examples of the present invention, and Experimental Examples 13 to 19 are comparative examples.

3. Joinability

An attempt was made to join an LT substrate having a diameter of 100 mm and a thickness of 250 μm to a supporting substrate having a diameter of 100 mm and a thickness of 230 μm cut out from each of the sintered bodies of Experimental Examples 2, 4, and 14. In the surface activation process before joining, a FAB (fast atom beam) gun was used to irradiate the two substrates with a neutral atomic beam of argon. Subsequently, the substrates were bonded together and pressed for minute at a joining load of 0.1 ton so as to directly join the supporting substrate to the LT substrate at room temperature. In the composite substrates obtained from the sintered bodies of Experimental Examples 2 and 4, substantially no voids were observed at the joining interface, the ratio (joining area ratio) of the actual joining area in the joining interface was 90% or more, and the substrates were satisfactorily joined. In contrast, in the composite substrate obtained from the sintered body of Experimental Example 14, voids were observed at the joining interface, and the ratio (joining area ratio) of the actual joining area in the joining interface was 80% or less. The joining area refers to the area where no voids are present, and the joining area ratio refers to the ratio of the joining area with respect to the area of the entire joining interface. Although a FAB gun was used here, an ion gun may be used instead.

The present application claims priority of International Patent Application No. PCT/JP2016/77627 filed on Sep. 20, 2016, and Japanese Patent Application No. 2017-129086 filed on Jun. 30, 2017, the entire contents of which are incorporated herein by reference.

What is claimed is:

1. A SiAlON sintered body represented by $Si_{6-z}Al_zO_zN_{8-z}$ ($0<z\leq4.2$) and having an open porosity of 0.1% or less and a relative density of 99.9% or more,
   wherein a ratio of a total of intensities of maximum peaks of components other than the SiAlON to an intensity of a maximum peak of the SiAlON in an X-ray diffraction diagram is 0.005 or less.

2. The SiAlON sintered body according to claim 1, wherein a surface of the SiAlON sintered body has a centerline mean roughness (Ra) of 1.0 nm or less in a 100 μM×140 μm measurement range.

3. The SiAlON sintered body according to claim 1, wherein a surface of the SiAlON sintered body has a difference (Pt) of 30 nm or less between a maximum peak height and a maximum valley depth in a 100 μm×140 μm measurement range.

4. The SiAlON sintered body according to claim 2, wherein the SiAlON sintered body has a Young's modulus of 180 GPa or more.

5. The SiAlON sintered body according to claim 3, wherein the SiAlON sintered body has a Young's modulus of 180 GPa or more.

6. A method for producing the SiAlON sintered body according to claim 1, comprising:
   preparing a raw material powder by selecting components from silicon nitride, aluminum nitride, alumina, and silica, each of the components having a purity of 99.8% by mass or higher so that Si:Al:O:N=(6-z):z:z:(8-z) (where $0<z\leq4.2$), determining mass ratios of the respective components, and mixing the components; forming the raw material powder into a predetermined shape; and then hot-press firing the formed raw material powder at a firing temperature of 1725° C. to 1900° C. and a press pressure of 100 to 300 kgf/cm² to obtain the SiAlON sintered body.

7. A method for producing the SiAlON sintered body according to claim 2, comprising:
   preparing a raw material powder by selecting components from silicon nitride, aluminum nitride, alumina, and silica, each of the components having a purity of 99.8% by mass or higher so that Si:Al:O:N=(6-z):z:z:(8-z) (where $0<z\leq4.2$), determining mass ratios of the respective components, and mixing the components; forming the raw material powder into a predetermined shape; and then hot-press firing the formed raw material powder at a firing temperature of 1725° C. to 1900° C. and a press pressure of 100 to 300 kgf/cm² to obtain the SiAlON sintered body.

8. A method for producing the SiAlON sintered body according to claim 3, comprising:
   preparing a raw material powder by selecting components horn silicon nitride, aluminum nitride, alumina, and silica, each of the components having a purity of 99.8% by mass or higher so that Si:Al:O:N=(6-z):z:z:(8-z) (where $0<z\leq4.2$), determining mass ratios of the respective components, and mixing the components; forming the raw material powder into a predetermined shape; and then hot-press firing the formed raw material powder at a firing temperature of 1725° C. to 1900° C. and a press pressure of 100 to 300 kgf/cm² to obtain the SiAlON sintered body.

9. A composite substrate in which a supporting substrate and a functional substrate are joined,
   wherein the supporting substrate is the SiAlON sintered body according to claim 1.

10. A composite substrate in which a supporting substrate and a functional substrate are joined,
    wherein the supporting substrate is the SiAlON sintered body according to claim 2.

11. A composite substrate in which a supporting substrate and a functional substrate are joined,
    wherein the supporting substrate is the SiAlON sintered body according to claim 3.

12. The composite substrate according to claim 9, wherein the substrates are directly joined.

13. The composite substrate according to claim 10, wherein the substrates are directly joined.

14. The composite substrate according to claim 11, wherein the substrates are directly joined.

15. An electronic device using the composite substrate according to claim 9.

16. An electronic device using the composite substrate according to claim 10.

17. An electronic device using the composite substrate according to claim 11.

18. An electronic device using the composite substrate according to claim 12.

19. An electronic device using the composite substrate according to claim 13.

20. An electronic device using the composite substrate according to claim 14.

* * * * *

UNITED STATES PATENT AND TRADEMARK OFFICE
CERTIFICATE OF CORRECTION

PATENT NO. : 10,399,906 B2
APPLICATION NO. : 15/703034
DATED : September 3, 2019
INVENTOR(S) : Yuki Nomoto et al.

Page 1 of 1

It is certified that error appears in the above-identified patent and that said Letters Patent is hereby corrected as shown below:

On the Title Page

Foreign Application Priority Data, Item (30)
Please add: "September 20, 2016 (JP) PCT/JP2016/077627"

Signed and Sealed this
Eighth Day of October, 2019

Andrei Iancu
*Director of the United States Patent and Trademark Office*